United States Patent [19]
Bahr et al.

[11] Patent Number: 4,771,929
[45] Date of Patent: Sep. 20, 1988

[54] FOCUSED CONVECTION REFLOW SOLDERING METHOD AND APPARATUS

[75] Inventors: Karl E. Bahr, Merrimack; Arthur V. Sedrick, Jr., Goffstown, both of N.H.

[73] Assignee: Hollis Automation, Inc., Nashua, N.H.

[21] Appl. No.: 17,327

[22] Filed: Feb. 20, 1987

[51] Int. Cl.[4] .................. B23K 1/20; B23K 31/02
[52] U.S. Cl. .................. 228/102; 228/180.2; 228/230; 228/232; 228/9; 219/85 BA; 219/85 BM; 219/85 E
[58] Field of Search .................. 228/102, 103, 180.1, 228/180.2, 230, 232, 9, 20, 46; 219/85 BA, 85 BM, 85 E, 85 R

[56] References Cited

U.S. PATENT DOCUMENTS

| | | | |
|---|---|---|---|
| 3,386,166 | 6/1968 | Tardoskegyi | 228/180.1 |
| 3,604,611 | 9/1971 | Lamberty | 228/180.1 |
| 3,769,675 | 11/1973 | Chartet | 228/20 |
| 4,140,266 | 2/1979 | Wagner | 219/85 E |
| 4,600,137 | 7/1986 | Comerford | 228/180.2 |
| 4,606,493 | 8/1986 | Christoph et al. | 228/180.1 |
| 4,654,502 | 3/1987 | Furtek | 228/180.1 |

FOREIGN PATENT DOCUMENTS 1555698 11/1979 United Kingdom ............ 228/232

Primary Examiner—Nicholas P. Godici
Assistant Examiner—Samuel M. Heinrich
Attorney, Agent, or Firm—Hayes, Davis & Soloway

[57] ABSTRACT

An improved solder reflow system for mass joining with solder electrical and electronic components affixed on a circuit board is provided. The system employs a combination of IR heating, recirculating forced hot air heating, and focused forced hot air heating to achieve solder reflow at throughput speeds and soldering quality not heretofore achievable.

24 Claims, 3 Drawing Sheets

FOCUSED CONVECTION REFLOW SOLDERING METHOD AND APPARATUS

BACKGROUND OF THE INVENTION

This invention relates to systems for soldering electrical and electronic components onto substrate boards, and more particularly to an improved apparatus and method for mass reflow soldering electrical and electronic components to the top and/or bottom side surfaces of substrate circuit boards or the like in a single pass. The invention has particular application to soldering of surface mounted devices (SMDs) such as chips or the like to printed circuit boards and will be described in connection with such application.

In response to recent demands for compact electronic appliances and instruments, there has been a tendency to use small, thin chip type electronic parts, i.e. surface mounted components or devices for mounting on printed circuit boards in place of conventional, discrete type, leaded components. The advent of surface mounted component technology has afforded striking new levels of efficiency to the circuit board designer and, at the same time, has posed new challenges for the manufacturing engineer.

Various techniques have been proposed by the art for mass soldering surface mounted components (and/or carriers therefor) to a circuit board. One technique involves fixturing the components to a circuit board, e.g., using an epoxy or the like, inverting the board, and then engaging the inverted board and fixtured components with molten solder by passing the inverted board and fixtured components in contact with a body of molten solder as, for example, through the crest of a standing solder wave. Such a process is described in U.S Pat. No. 4,465,219 to Kenshi Kondo.

It has also been proposed to solder surface mounted components to a circuit board using a solder cream or paste, or a solder preform or the like. In such prior art technique, the surface mounted components are loaded in position on a circuit board, together with suitable solder preforms or a solder cream or paste, and the circuit board and loaded components are heated to a temperature sufficient to reflow the solder. Heating the solder to reflow can be accomplished by baking the circuit board and components in a radiant furnace or the like. Alternatively, the circuit board and components may be immersed in a vapor heated to a temperature above the melting point of the solder, in accordance with the so-called vapor phase soldering or condensation soldering process. Such a process is described in U.S. Pat. Nos. 3,866,307 and 4,321,031, which are given as exemplary. Radiant heating reflow soldering and vapor (condensation) soldering have achieved a certain degree of commercial acceptance although each technique has certain drawbacks. Radiant heating reflow soldering techniques have a tendency to overheat components which could cause damage to heat sensitive components, and radiant heating reflow soldering techniques are susceptible to line-of-sight shadowing and/or thermal absorption differences due to different optical and/or mass characteristics of components and thus may not be entirely satisfactory for many applications. And, the fluid used to create the vapor for condensation soldering is quite expensive, and the thermal decomposition products of the fluid produced are dangerous to health. Moreover, both radiant heating and condensation soldering techniques require relatively long warmup and product changeover lead times.

U.S. Pat. No. 4,600,137 to Matthias F. Comerford entitled METHOD AND APPARATUS FOR MASS SOLDERING WITH SUBSEQUENT REFLOW SOLDERING and assigned to the common assignee of this application discloses an improved mass soldering system which overcomes the aforesaid and other disadvantages of the prior art and also permits mass soldering components to both sides of a printed circuit board in a single pass. More particularly, in accordance with the Comerford patented soldering system, a circuit board containing components populating both top and bottom surfaces of the board is first subjected to a first mass soldering operation in which the bottom side surfaces of the board and components thereon are passed in contact with a body of molten solder as by passing through the crest of a standing solder wave. The first mass soldering operation reportedly also imparts substantial heat energy to the board, which heat energy is conducted through to the top side surface of the board. Additional heat energy then is supplied to the top side surface of the board to reflow preapplied solder cream or paste or solder preforms on the board top side surface. The Comerford patented soldering system comprises a fluxing station wherein flux may be applied to the bottom surface of the circuit board; a preheater station wherein the flux is activated and the board prepared for soldering; a first mass soldering station wherein the bottom side surface of the printed circuit board may be brought into contact with a pool of molten solder; and a second mass soldering station wherein preapplied solder cream or paste or solder preforms on the top side surface of the printed circuit board may be heated to reflow. In a preferred embodiment of the Comerford patented soldering system the first soldering station comprises a wave soldering assembly consisting of two wave-forming solder sumps including a first nozzle for forming a bidirectional wave and a second nozzle for forming a second substantially unidirectional wave, and the second mass soldering station comprises a convection heating assembly consisting of one or more heated nozzles for directing heated fluid streams substantially vertically downwardly onto the top side surface of the board. In a particularly preferred embodiment of the invention the heated fluid comprises heated air. Completing the Comerford patented apparatus is means for transporting the circuit boards to be soldered in-line in timed sequence between the first mass soldering station and the second mass soldering (reflow) station.

The Comerford patented mass soldering system has been incorporated into mass soldering systems available from Hollis Automation, Inc. and is considered to constitute a significant advance and contribution to the art of mass soldering. And, while the above described Comerford patented mass soldering system can be used for mass soldering circuit boards containing only surface mounted components, the Comerford patented mass soldering system is overly complex for soldering circuit boards having no leaded components.

It is thus a primary object of the present invention to provide a mass soldering system, i.e., apparatus and process, which overcomes the aforesaid problems of the prior art.

Another object of the present invention is to provide an improved apparatus and process for mass reflow soldering components to a circuit board.

Still other objects will appear obvious and in part will appear hereinafter.

The invention accordingly comprises the processes involving the several steps and relative order of one or more of such steps with respect to each other and the apparatus possessing the features, properties and relations of elements which are exemplified in the following detailed description and the scope of the application of which will be indicated in the claims.

In the following detailed description of the invention, the term "component" refers to so-called surface mounted components or devices such as chip components as well as carriers therefor. The term "component lead" refers to that part of the metal conductor of an electrical or electronic component that is joined to the printed circuit board pattern. The term "land" as used herein refers to that part of metallic pattern on the printed circuit board to which a component or component lead is joined by solder, the terms "top side surface" and "bottom side surface" as used herein with reference to the circuit board are meant simply to refer to the opposed board surfaces of the circuit board; the terms "top" and "bottom" respectively denote spatial orientation of the circuit board only as it is being processed in the soldering apparatus in accordance with the present invention. The term "mass reflow soldering" is intended to refer to the soldering technique in which solder connections are made by reflow of preapplied solder preforms, or solder cream paste on a circuit board. The term "forced convection" as used herein with reference to the convection heating means is meant to differentiate driven convective heating means as employed in the invention from natural convection movement. The terms "relatively low velocity" and "relatively high velocity" as used herein with reference to the convection heating means are employed as relative terms.

The present invention provides a novel system, i.e. method and apparatus for reflow soldering surface mounted components to one or both sides of a circuit board in a single pass whereby to mechanically and electrically join the components to the circuit board.

More particularly, in accordance with the present invention, there is provided a solder reflow system for mass joining with solder electrical and electronic components affixed on a circuit board and populating one or both surfaces of the board by heating the board and components sufficiently to reflow preapplied solder in the form of preforms and/or solder paste or cream by means of a combination of heat sources, including a first, heating zone comprising a combination of infrared heating means and relatively low velocity forced convection hot gas heating means for preheating the board and components and leveling the temperature of the preheated board and components to just below the reflow temperature of the solder; and a second heating zone comprising relatively high velocity forced convection hot gas heating means for raising the temperature of the board and components sufficiently high to effect reflow of the solder thereon. In a preferred embodiment of the invention, heat produced by the infrared heating means in the first preheating zone is captured at least in part and is recycled in the convection hot gas stream. Completing the system are means for transporting the circuit boards to be soldered in-line in timed sequence between the first (preheating) zone and the second (reflow) zone.

For a fuller understanding of the object of the present invention, reference should be had to the following detailed description taken in connection with the accompanying drawings in which like numerals depict like parts, and in which.

Figure 1:
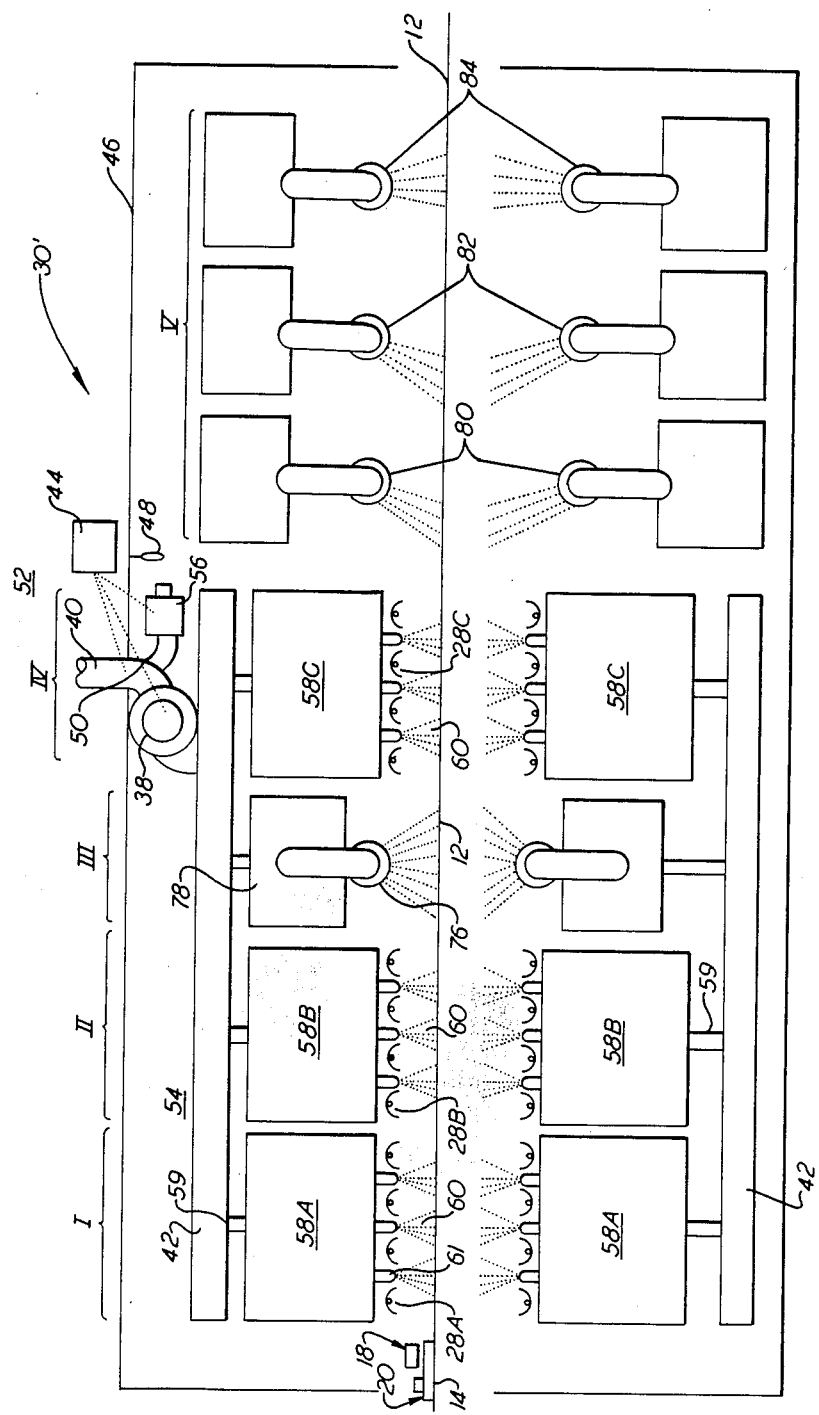
FIG. 1 is a side elevational view, diagrammatically illustrating a mass soldering system according to the present invention.
Figure 2:
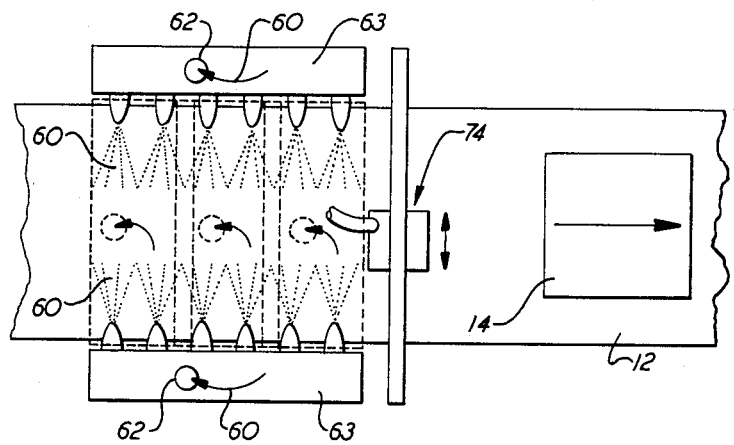
FIG. 2 is a top plan view of a portion of the mass soldering system shown in FIG. 1.
Figure 3:
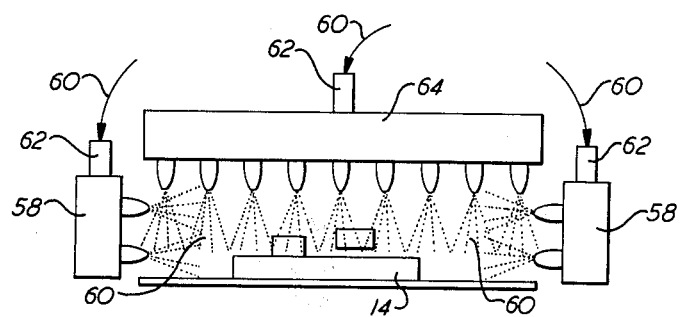
FIG. 3 is an end view of the mass soldering system shown in FIG. 1.

Referring to FIGS. 1 to 3, a printed circuit board 14 is loaded at an insertion station (not shown) with a plurality of electrical and electronic components 18 on the top side surface 20 of the board. For convenience of illustration, the components are shown loaded only on the top side surface of the board. However, as will become clear from the description following, the invention is equally useful for reflow soldering components to the top and/or bottom side surfaces of a circuit board. The board 14 comprises an insulated wiring board having one or more printed metallic conductors (not shown) on the board top side surface 20. Components 18 are temporarily affixed in known manner in suitable locations on the board top side surface by means of a solder paste or the like applied to the component leads and circuit lands. If desired components 18 also may be affixed to the circuit board by means of an epoxy adhesive or the like applied to the component bodies.

The component carrying board is then loaded on a conveyor 12 for travel through the solder reflow apparatus 1n accordance with the present invention as indicated generally at 30'. Reflow apparatus 30' is divided into a preheat zone comprising plurality of functional heat management zones, indicated by the Roman Numerals I to IV which correspond to the heat management zones and description temperature graph of FIG. 4 as will be described hereinbelow, and a reflow zone indicated by Roman Numeral V. As will be described below, dividing the reflow apparatus 30' into a plurality of heat management zones permits controlled heating whereby to provide a desired temperature ramping, and stabilization of temperature whereby to avoid overheating and/or underheating of individual components.

Figure 4:
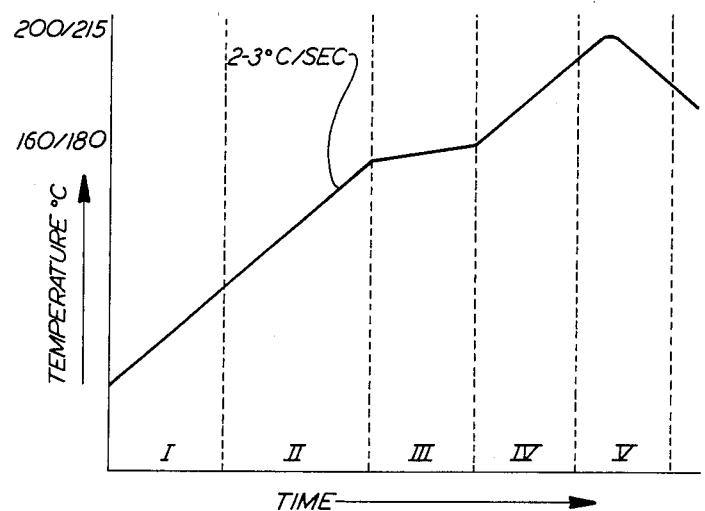
FIG. 4 is a graph illustrating measurements representing time/temperature profiles of the top side surface of circuit boards passing through the mass soldering system of FIGS. 1–3 operating in accordance with the teachings of the present invention.

More particularly, with reference to FIGS. 1 and 4, and as will be further described in detail hereinafter, in preheating Zone I, heating is primarily effected by means of an infra-red (IR) heat source, with little or no supplemental convective gas heating. In preheating Zone II, IR heating is supplemented with a relatively low velocity hot gas convective heating whereas to maintain the increasing temperature ramp, while levelling, in part, the temperature differences resulting from IR absorption rates due to reflectivity, shadowing and nesting of components relative to one another. In preheating Zone III, heating is primarily achieved by means of relatively low velocity heated gas convective heating with IR heating optional. Preheating Zone III contributes to the increasing temperature ramp, while further levelling component temperature differences and achieving an efficiency balance between component temperature to air temperature. Preheating Zone IV comprises additional relatively low velocity hot gas convection heating means for heating the circuit board and components to just below the reflow of the temperature of the solder. Finally, in reflow Zone V, heating is achieved by means of one or a plurality of hot gas knives which produce a relatively high velocity convective gas stream for heating the components and circuit board top side surface to a temperature above the reflow temperature of the solder.

Turning now to FIGS. 1 to 3 of the drawings, the heat management zones as provided by the apparatus of the present invention will now be discussed in detail. While in certain instances fluids other than air may be used as the hot gas working fluid for the convection heating and should be considered as being within the scope and spirit of the present invention, the preferred working fluid generally is air. More particularly, the apparatus comprises an electrically powered, variable speed blower 38 connected between its inlet pipe 40 and an air supply plenum 42 which, in turn, is connected to supply air to various smaller plenums and nozzles to be described in detail below. In a preferred embodiment of the invention, a control system 44 is connected to receive temperature inputs from sensors within the enclosure 46 of reflow station 30' as typified by the sensor indicated at 48. Preferably temperature sensors will be located within the individual plenums. Temperature sensors and the types of control systems employing them are well known in the art and are available commercially and, therefore, in the interest of simplicity and avoiding redundancy herein, they will not be described in detail.

Control system 44 is operatively connected to control the speed of the blower 38, a damper 50 controlling the mixture of outside air 52 and recirculated enclosure air 54 from within the enclosure 46 being pumped to the plenum 42, one or more dampers or valves (not shown) for controlling the volume and temperature of heated air directed to the various air outlet nozzles as will be described in detail hereinafter, and (optionally) an in-line heater 56 for adding heat to the system when the enclosure air 54 alone is of insufficient temperature to affect the desired objectives.

A typical arrangement for preheating Zones I, II and III is shown in top view in FIG. 2 and in end view in FIG. 3. Pairs of spaced plenums 58A, 58B, 58C are disposed above and below conveyor 12 carrying the printed circuit boards 14 thereon. Plenums 58A, 58B, 58C are connected to receive convection air 60 through inlets 59 from the air supply plenum 42 and contain a plurality of upwardly and downwardly facing nozzles 61 through which the heated air 60 emerges to flow across the broad surfaces of a printed circuit board 14 passing therebetween. Preferably, but not necessarily, nozzles 61 are disposed between banks of spaced IR heaters 28A, 28B, 28C. The latter preferably comprise quartz-lamp, high mass type heaters as are conventionally employed as IR preheaters in mass soldering systems. In like manner, side plenums 63A, 63B, 63C are disposed on opposite sides of the conveyor and are also connected to receive convection air 60 through inlets 62 from the heated air supply plenum 42. Heated air may be recaptured and recycled by suitable return means (not shown) adjacent the ends of enclosure 46. Alternatively, the side plenums may be plumbed as returns.

One or more of the banks of IR heaters 28A, 28B and 28C in the preheating Zone are independently operably and include independent feedback control. In a preferred embodiment of the invention, the preheating Zone comprises six separately controlled banks of IR heaters disposed three banks above and three banks below the travel path of the circuit boards. In like manner plenums 58A, 58B, 58C and 63A, 63B, 63C are arranged so that the air flow and temperature of air emanating from these plenums may be separately controlled. In a particularly preferred embodiment of the invention, the temperature of the air emanating from the first in-line plenums 58A and 63A is adjusted to run slightly cooler than the temperatures expected to be reached by the circuit board and components so as to force temperature leveling. In preheating Zones II, III and IV, the temperature of the air emanating from the plenums may be at or slightly above the preheat target temperature for the board and components.

Figure 5:
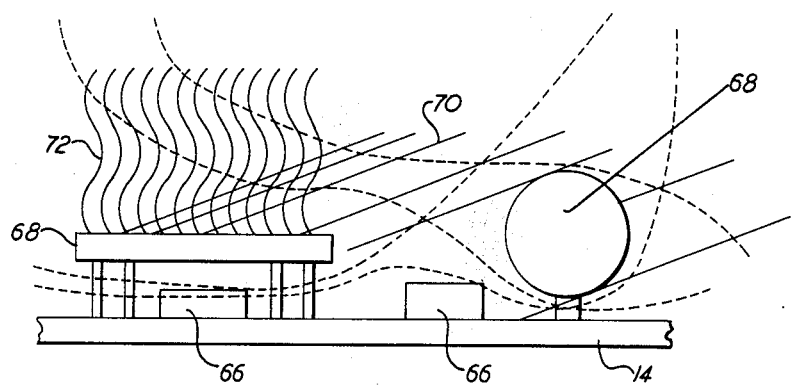
FIG. 5 is an enlarged simplified drawing illustrating the heating effects achieved in accordance with the teachings of the present invention.

The effect of this arrangement is illustrated in FIG. 5. Low profile components 66 are shadowed by higher profile components 68 from receiving the IR radiation indicated by the lines 70. Assuming that one of the shadowing components 68 is absorbing the IR radiation and re-radiating heat as indicated by the wave lines 72, the convection air 60 as indicated by the dashed lines so numbered, passes over, under, around and through the components 66, 68 picking up heat from and cooling the overheated, radiating components and transferring the heat to the cooler, underheated components. The overall effect is a stabilizing of the entire temperature profile of the board 14 and components 66, 68 to a temperature approximating that of the temperature of the air 60. Thus, by controlling the speed of the blower 38 and/or the mixture of outside air 52 and inside air 54 (and in-line heater 56 as necessary), a desired temperature profile can be achieved.

As shown in FIG. 2, one or more adjustable nozzle assemblies 74, connected to receive heated air 60 optionally can be provided for selectively directing air flow against particularly troublesome components during a specific soldering operation. In this manner, selected components could be selectively cooled or heated, whereby to achieve a more level and consistent temperature of the various components on the board, thus compensating for the individual components' different IR absorption rates due to reflectivity, shadowing and nesting. As those skilled in the art will appreciate, while not specifically shown nor described herein for the sake of simplicity, the apparatus for each of preheating Zones I, II and IV could be separately pumped, mixed and/or heated under separate temperature control as may be required for the particular operation.

The hot air knife 76 of preheating Zone III preferably produces a higher velocity stream of heated air 60 than that employed in preheating Zones I, II and IV, and may also incorporate a separate heater within its supply plenum 78, if desired.

Zone V comprises the reflow section of the soldering system made in accordance with the present invention. In the preferred embodiment of the invention Zone V comprises three separately controlled hot air knives 80, 82 and 84, similar in construction to the hot air knives taught in U.S. Pat. No. 4,410,126 to Harold T. O'Rourke, assigned to the common assignee Hot air knives 80, 82 and 84 are operated at higher temperature and flow rates than the hot air nozzles in preheating Zones I to IV previously described. Unlike the hot air nozzles in preheater Zones I to IV which are operated primarily to enhance thermal leveling, the hot air knives in preheater Zone V are designed and operated primarily to input sufficient additional heat to substantially uniformly raise the temperature of the board and components sufficiently high to reflow the solder cream or paste and/or solder preforms on the board. Thus, while the air employed in preheating Zones I to IV generally may be at a temperature ranging from about ambient to about 350° F., the hot air employed in reflow Zone V should be at a temperature in the range of about 350° F. to about 900° F., or higher.

The air employed in preheating Zones I to IV may in certain applications be at somewhat higher temperatures, e.g. up to about 500° F. or even higher. However, due to the relatively low air flow rates employed in preheating Zones I to IV the heat input from operating at such higher temperatures generally will not be sufficient to effect reflow in Zones I to IV. Air flow rates may be adjusted emperically in Zones I to IV to achieve the desired temperature leveling and in Zone V to achieve the desired reflow. Actual flow rates depend on a number of variables including target temperatures, heat input from IR heaters, number, size, configuration and spacing of air nozzles or air knives, ambient temperatures and work load. Generally, for the purposes of this invention good results have been achieved operating the flow rates in the range of about 10 to about 50 feet per second as measured at the air nozzle air knife outlet, and operating the relatively high velocity convection heating means at air flow rates above about 50 feet per second as measured at the air nozzle or air knife outlet.

Initial tests indicate that the thermal levelling of the present invention can improve the process throughput from the normal 1.0 to 1.5 fpm for a pure IR reflow system to at least 2.5 to 3.5 fpm. Moreover, as can be readily appreciated from the description hereinbefore, the thermal levelling accomplished in the preheating Zones I to IV virtually eliminates the possiblity of component or board damage due to thermal shock and/or overheating.

In order to achieve better heating uniformity of the components and circuit board top surface, the heated convective gas in the preheating zone or zones is flooded or flowed, at relatively low velocity, in conjunction with the infra-red preheating. The low pressure, low velocity flow of heated convective air produces an improved distribution of component and board surface temperature. Obviously, the convective gas flow in preheating Zones I to IV should be flowed over the circuit board and components at a velocity sufficient to more evenly distribute surface temperatures, but not so high as to disturb the components. The convective air flow thus lowers the temperature of high IR absorption components and raises the temperature of lower IR absorption components.

A feature and advantage of the present invention is that the system utilizes normally wasted thermal heat by re-circulating IR derived heat within the system enclosure. However, should the recirculated air reach a steady state higher than desired range for preheat or reflow soldering, ambient makeup air readily can be added through a thermistor controlled dampened inlet. Additional heat can be provided, if required, by a heat source within the air manifold.

As noted supra, the reflow Zone V comprises one or a plurality of heated air knives, fluid jets, slots, nozzles or the like indicated at 80, 82, 84, from which a relatively high pressure heated fluid stream such as air is directed to the top side surface of the board. A single air knife can be used under certain circumstances; however, it has been found that a minimum of two and preferably three air knives are preferred in order to achieve desired enhancement of thermal levelling, and at the same time achieve good solder reflow. Moreover, when a plurality of hot air knives is employed in reflow Zone V, it is found that operating the first hot air knife just about at the normal reflow temperature of the solder or even slightly below the reflow temperature may further enhance thermal levelling. In such case the remaining air knife or air knives 82, 84 should be adapted to preheat the air to a temperature above about 400° C. so as to provide the necessary heat input to achieve reflow temperature. Air flow from hot air knives 82 and 84 should, of course, be at a velocity sufficient to provide the desired heat transfer so as to provide adequate heat input to effect reflow soldering and will depend on component density, etc.

The target operating temperatures also will vary depending on the particular solder alloy employed.

Completing the apparatus is a conveyor system indicated generally at 12. The latter is of conventional construction and typically comprises a pair of spaced conveyor rails and suitable drive means (not shown). Preferably conveyor system 12 operates substantially in the horizontal plane so that boards being processed are carried by conveyor 12 along a substantially horizontal travel path. Operating in the horizontal mode minimizes possible problems of component shifting on the board top surface and also simplifies loading and unloading transitions.

A particular feature and advantage of the present invention is the ability to create substantially uniform heating of the component surface temperature of a circuit board in a reflow process independent of temperature and color charcteristics of components' reflectivity, shadowing and nesting, and the like, thus providing more uniform heating and soldering of the components and eliminating possible thermal damage to individual components. Other features and advantages of the present invention include enhanced energy efficiency due to capture and recirculation of IR heated air, and elimination of expensive and potentially dangerous chemicals as are required for vapor reflow soldering systems. Additionally, the present invention permits emergency shutdown under conditions which would eliminate or at least substantially reduce the possibility of damage to boards, permits easy and rapid maintenance and repair, and permits rapid adjustment in overall system temperatures so that warm-up and product changeovers may be accomplished quickly and easily. Moreover, the rapidity of the reflow accomplished by the focused convection heated air in accordance with the present invention minimizes intermetallic growth in the joints, since exposure times at reflow temperatures are extremely short.

Various changes may be made in the foregoing invention. For example, IR heaters could be included in the reflow Zone V for providing additional heat input. The combination of IR and convective heating also may be advantageously employed for temperature leveling in the mass soldering system of Comerford, U.S. Pat. No.

4,600,137. Also, if desired, forced cooling means may be included immediately following the reflow Zone V.

Still other changes may be made in accordance with the present invention without departing from the spirit and scope thereof. Accordingly, it is intended that all matter contained in the above description or shown in the accompanying drawings shall be interpreted in an illustrating and not in a limiting sense.

We claim:

1. A solder reflow apparatus for mass joining with solder electrical and electronic components positioned on a circuit board, and comprising in combination:
   (a) a preheating zone consisting of a combination of IR heating means and convective heating means for heating said board and components to just below the solder reflow temperature, said IR heating means and said convective heat means being arranged to provide temperature ramping and stabilization thereby avoiding overheating of individual components while equalizing the temperature differences among said board and individual components; and
   (b) a solder reflow zone comprising convective heating means for directing heated gas stream across said board and components to raise the temperature of said board and components sufficient to reflow solder preforms and/or solder paste or cream thereon.

2. A solder reflow apparatus according to claim 1, wherein said preheating zone is contained within a gas-containing enclosure, and including recirculating means for withdrawing hot gas from the enclosure heated by radiation from the components and recycling it into the enclosure as said convection stream.

3. A solder reflow apparatus according to claim 2, and additionally comprising:
   (a) heater means disposed in-line with said recirculating means for adding additional heat to said recycle gas stream before reintroducing it into the enclosure as said convection stream; and
   (b) temperature control means for sensing the temperature within said enclosure and for adjusting said heater means to heat said recycle gas stream to a predetermined temperature.

4. A solder reflow apparatus according to claim 2, and additionally comprising:
   (a) means operably connected to said recirculating means for introducing cooler outside gas to said recycle stream before reintroducing it into the enclosure; and,
   (b) temperature control means for sensing the temperature within said enclosure and for adjusting the mixture of said outside gas and said recycle stream to a predetermined temperature.

5. A solder reflow apparatus according to claim 1, and additionally comprising:
   adjustable nozzle means for directing a portion of said convection stream across and around selected components.

6. A method for mass reflow soldering electrical and electronic components positioned on the top side surface of a circuit board by heating the board and components sufficiently to reflow solder preforms, solder paste or cream thereon to electrically and mechanically join any components thereon to the board comprising the steps of:
   (a) subjecting said board and components to a combination of IR heating and convective heating whereby to raise the temperature of said board and components to just below the solder reflow temperature; and
   (b) directing a heated gas stream across said preheated board and components whereby to raise the temperature of said board and components sufficient to reflow any solder preforms, solder paste or solder cream thereon.

7. A method for mass reflow soldering according to claim 6, wherein said preheating is preformed within a gas-containing enclosure, and including the step of withdrawing hot gas heated by radiation from the components from the enclosure and recycling at least a portion of the withdrawn gas said convection stream.

8. A method for mass reflow soldering according to claim 7, and additionally comprising the steps of sensing the temperature within said enclosure, and heating the recycle gas to a predetermined temperature.

9. A method of mass reflowing soldering according to claim 7, and additionally comprising the steps of sensing the temperature within said enclosure, and mixing outside gas with the recycle gas to a predetermined temperature.

10. A method of mass joining according to claim 6, and additionally comprising the step of directing a portion of the convection stream of gas across and around selected components.

11. Solder reflow apparatus for mass joining with solder electrical and electronic components positioned on a circuit board by heating the board and components sufficiently to reflow solder preforms and/or solder paste or cream thereon to electrically and mechanically join any components thereon to the board comprising:
   (a) A preheating station consisting of:
      (i) infrared heating means for directing infra-red energy onto the components and board; and
      (ii) convective heating means for directing relativley low velocity heated gas stream onto the components and board to aid in levelling component temperature to prevent large differences in temperature of different sized/colored components which could arise due to radiant heat transfer only, whereby to preheat the circuit board and components to a substantially uniform temperature just below the reflow temperature of the solder; and
   (b) A reflow station comprising means for directing a relatively high velocity focused heated gas stream from at least one gas knife to raise the temperature of the board and components to above the reflow temperature of the solder whereby the reflow of the solder is accomplished.

12. A solder reflow apparatus according to claim 11, wherein said means for directing said relatively low velocity gas stream onto the components and solder comprises:
   (a) means for providing a source of hot gas; and,
   (b) means disposed for directing said hot gas stream as a broad convection stream across and around the components whereby cooler components are heated and hotter components are cooled thereby to stabilize the components at a substantially uniform temperature below the solder reflow temperature.

13. A solder reflow apparatus according to claim 12, contained within a common gas-containing enclosure; and, wherein said hot gas providing means includes means for withdrawing from the enclosure hot gas heated by radiation from the components and recycling at least a portion of the withdrawn hot gas into the enclosure as said convection stream.

14. A solder reflow apparatus according to claim 13, and additionally comprising:
   (a) heater means disposed in-line with said means for withdrawing for adding additional heat to said recycle hot gas stream; and,
   (b) temperature control means for sensing the temperature within said enclosure for employing said heater means to heat said withdrawn hot gas to a predetermined temperature.

15. A solder reflow apparatus according to claim 13, and additionally comprising:
   (a) outside gas introduction means operably connected to said means for withdrawing for adding cooler outside gas to said hot gas recycle stream; and
   (b) temperature control means for sensing the temperature within said enclosure and for mixing said outside gas with said withdrawn hot gas to achieve a predetermined temperature.

16. A solder reflow apparatus according to claim 12, and additionally comprising:
   adjustable nozzle means for directing a portion of said convection stream of gas across and around preselected components.

17. A mass reflow soldering method for mass joining with solder electrical and electronic components populating the top side surface of a circuit board along with solder preforms and/or solder paste or cream thereon comprising the steps of:
   (a) Preheating said circuit board, solder and components by
      (i) directing radiant heat onto the board, solder and components to raise the temperature thereof towards a temperature approaching the solder reflow temperature; and
      (ii) directing a first, relatively low velocity heated gas stream across and around said board, components and solder whereby cooler components are heated and hotter components are cooled thereby to stabilize the components at a substantially uniform temperature slightly below the reflow temperature of solder; and
   (b) Reflowing said solder by directing a second, relatively high velocity heated gas stream as a narrow knife-edged stream against the components and board to additionally heat the top side surface of the board, solder and components to a temperature above the reflow temperature of solder, whereby to electrically and mechanically join any components thereon to the top side surface of the board.

18. A mass reflow soldering method according to claim 17, wherein said soldering is accomplished within a common gas-containing enclosure and said step (b) of heating to a common uniform temperature comprises the steps of:
   (a) withdrawing hot gas from the enclosure heated by radiation from the components;
   (b) recycling the hot gas into the enclosure as said first, relatively low velocity heated gas stream and directing it onto the top side surface of the board, solder and components.

19. A mass soldering method according to claim 18, and additionally comprising the step of:
   directing a portion of said recycle gas stream across and around particular components of high thermal differential.

20. A mass soldering method according to claim 18 and additionally comprising the steps of:
   (a) sensing the temperature within said enclosure; and
   (b) heating the recycle gas stream to a predetermined temperature prior to reintroducing the gas stream into the enclosure.

21. A mass soldering method according to claim 18, and additionally comprising the steps of:
   (a) sensing the temperature within said enclosure; and
   (b) mixing outside gas with the recycle gas stream to achieve a predetermined temperature prior to reintroducing the recycle gas stream into the enclosure.

22. Solder reflow apparatus for mass joining with solder electrical and electronic components positioned on a circuit board and populating the top side surface of the board by heating the top side surface of the board sufficiently with infra-red energy and hot gas to reflow solder preforms and/or solder paste or cream thereon to electrically and mechanically join any components thereon to the top side surface of the board, wherein said apparatus includes an entrance, an exit, and means for transporting a circuit board to be soldered between said entrance and said exit and comprising in combination:
   (a) a preheating zone consisting of a combination of IR heating means and convection heating means for heating said board and components to a first, substantially uniform temperature just below the reflow temperature of said solder preforms, paste or cream, said IR heating means and said convective heating means being arranged to provide temperature ramping and stabilization thereby avoiding overheating and underheating of individual components while equalizing the temperature differences among said board and said individual components; and
   (b) a solder reflow zone comprising at least one knife-edged hot gas nozzle for directing a heated gas stream onto said board and components so as to heat said board and components to above the reflow temperature of said solder.

23. A solder reflow apparatus according to claim 22, wherein said means for transporting comprises a substantially horizontal conveyor means, and said at least one knife-edged gas nozzle is substantially vertically downwardly directed at said travel path.

24. A solder reflow apparatus according to claim 23, wherein said solder reflow zone comprises three gas nozzles.

* * * * *